Jan. 22, 1957 R. N. HALL 2,778,980

HIGH POWER JUNCTION SEMICONDUCTOR DEVICE

Filed Aug. 30, 1954

Inventor:
Robert N. Hall,
by Paul A. Frank
His Attorney.

2,778,980
Patented Jan. 22, 1957

2,778,980

HIGH POWER JUNCTION SEMICONDUCTOR DEVICE

Robert N. Hall, Schenectady, N. Y., assignor to General Electric Company, a corporation of New York Application August 30, 1954, Serial No. 453,018
9 Claims. (Cl. 317—235)

Figure 1:
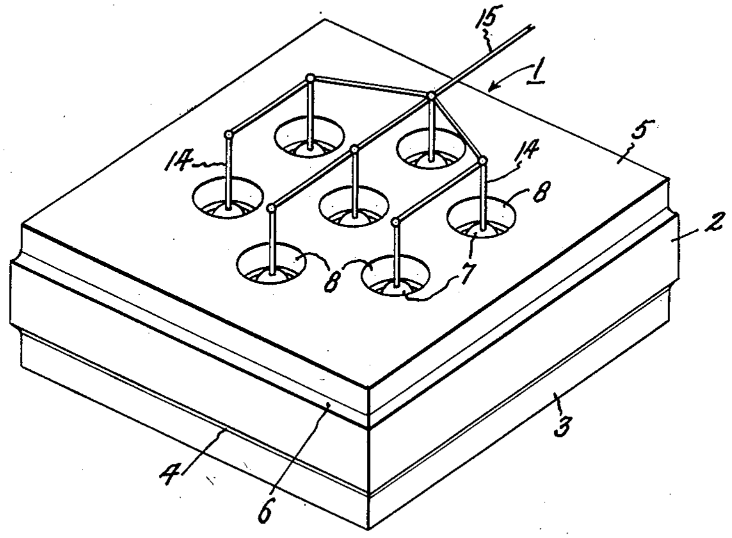

My invention relates to semiconductor devices, and more particularly to transistors of the P-N junction type.

Semiconductors, such as germanium and silicon, have been conventionally classified as either positive (P-type) or negative (N-type), depending primarily upon the type and sign of their predominant conduction carriers. Whether a particular semiconductor body exhibits N-type or P-type characteristics depends primarily upon the type of significant impurity elements or activators present in the semiconductor. Some such activator elements, called donors, function to furnish additional electrons to the semiconductor so as to produce an N-type semiconductor with an electronic excess, while others, called acceptors, function to take electrons from the semiconductor body to create P-type semiconductors with an excess of positive conduction carriers or "positive holes." P-N junction semiconductor units have a zone of P-type semiconductor adjoining a zone of N-type semiconductor, forming an internal space charge barrier having a relatively large or broad area as distinguished from the point contact type of device. This type junction possesses marked rectifying properties, as well as thermoelectric and photoelectric properties.

A semiconductor body having a region of one conductivity type adjoining two regions of opposite conductivity type forming two P-N junctions can be used to make a three terminal amplifying device known as a transistor. In such devices, the common zone is the base and the zones adjoining are the emitter and collector, respectively. Transistor action is dependent upon a small change in the current flowing into the emitter effecting a large change of current flowing out of the collector. More basically, transistor action is dependent upon the migration of minority charge carriers from the emitter to the collector. What constitutes a minority charge carrier depends upon the conduction characteristics of the body in which it exists. Thus in an N-type semiconductor body a positive hole is a minority carrier. Conversely in a P-type semiconductor body an electron constitutes a minority carrier. The period of existence, or lifetime, of a minority carrier within a semiconductor body is very short, and depends upon many factors. Short minority carrier lifetime is a limitation upon the characteristics and usefulness of a transistor. For proper transistor action, the spacing between the emitter, at which minority carriers are injected, and the collector, at which minority carriers are collected, must be a distance which may be traversed by a minority carrier of average lifetime. For this reason, in transistors, the spacing between emitter and collector electrodes must necessarily be small, the optimum spacing being dependent upon the frequency at which the device is to be operated.

Conventional low-power junction type transistors, such as that shown in my copending application Serial No. 187,478, filed September 29, 1950, and assigned to the same assignee as the present invention, usually take the form of an "opposed dot" device. In such devices the base region of one conductivity type semiconductor comprises a thin crystalline wafer and the emitter and collector comprise impurity-activated, opposite-conductivity regions on opposed major faces of the semiconductor wafer. In such devices the distance between emitter and collector electrodes may be accurately determined and controlled by controlling the thickness of the wafer and the depth of penetration of activator impurities into the opposite major faces. The base connection for this type of transistor may be conveniently made to be the end or edge of the semiconductor wafer, because in low power transistors the base connection need not be in close proximity to the emitter or collector electrodes. However, as the power rating of the transistor is increased, the distance between base, emitter and collector electrodes becomes more critical.

When minority carriers are injected into the semiconductor body at the emitter electrode, the semiconductor body, in order to maintain electrical neutrality, draws majority carriers from the base electrode. A portion of the number of minority carriers injected at the emitter electrode unite with the majority carriers taken from the base electrode, and mutual destruction of these charges occurs in the process generally referred to as "re-combination." The current caused by recombining majority carriers entering the semiconductor body at the base electrode is not appreciable so as to cause excess heating in low power transistors. However, in high power transistors, this current becomes appreciable and it becomes necessary and desirable that the base electrode be located in close proximity to the emitter and collector electrodes, particularly to the emitter.

One type power transistor constructed to locate the base contact in close proximity to the emitter contact, while still maintaining the critical and necessarily small distance between emitter and collector electrodes, generally comprises a base electrode fused to one major face of a semiconductor wafer and emitter and collector electrodes fused to the opposite major face of the semiconductor wafer in close proximity to one another. This type transistor, however, requires extreme care in construction and is not well-suited for mass production methods because emitter-to-collector spacing (which is the most critical in a transistor) may be maintained constant only with great difficulty when the emitter and collector electrodes are on the same major face of a semiconductor wafer. Additionally, when emitter and collector electrodes are located upon the same major face of the semiconductor wafer, it is extremely difficult, if not impossible, to conduction-cool the collector electrode in order to attain high-power operation.

A further difficulty which must be overcome in power transistor construction is that of increasing power output without sacrificing efficiency. This difficulty arises due to the fact that power rating does not increase linearly with increased collector and emitter junction area. Thus, for single emitter and collector junctions there is a maximum size beyond which increased size results in decreased efficiency. Therefore, it may be readily seen that high power transistors may not be obtained by merely increasing the size of emitter and collector junctions.

It is an object of this invention, therefore, to provide an improved P-N junction transistor.

It is another object of this invention to provide a junction transistor suitable for operation at high power levels.

A further object of this invention is to provide a high power transistor having emitter, collector and base electrodes all located in close proximity to one another.

Still another object of the invention is to provide a power transistor, the collector electrode of which may be conduction-cooled.

According to a preferred embodiment of my invention, a wafer of semiconductor material is provided having a collector electrode attached to one major face and an apertured base electrode to the opposite major face. A plurality of emitter electrodes contact the latter face of the semiconductor wafer through the apertures in the base electrode.

The novel features which are believed characteristic of the invention are set forth in the appended claims. The invention itself, however, together with further objects and advantages thereof may best be understood by reference to the following description taken in connection with the accompanying drawing in which, Fig. 1 is a perspective view of a P-N junction transistor embodying the invention, Fig. 2 is a cross-sectional view of a portion of the transistor of Fig. 1.

Figure 2:
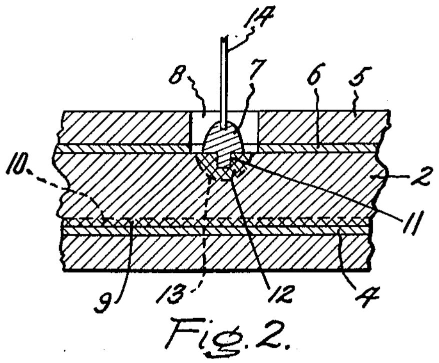

In Figs. 1 and 2 a P-N junction transistor illustrative of the invention is generally denominated as 1. Transistor 1 comprises a wafer of semiconductive material 2, a collector plate 3 soldered to semiconductor wafer 2 by means of activator solder 4, a base electrode 5 soldered to semiconductor wafer 2 by means of activator solder 6, and a plurality of emitter electrodes 7 located within circular apertures 8 in base plate 5. Semiconductor body 2 is a crystalline wafer having its length and width dimensions much greater than its thickness dimension. By way of example, wafer 2 may be a crystalline wafer of N-type germanium, preferably monocrystalline in structure, and may conveniently be cut from a single crystal grown by seed crystal withdrawal from a melt of germanium impregnated with a trace of a donor activator element. The melt from which the crystal is grown may be impregnated with a trace of an element such as antimony, phosphorus, or arsenic to give it negative conduction characteristics.

Collector plate 3 may comprise a flat plate of fernico or nickel or any material having a thermal coefficient of expansion of the same order of magnitude as germanium. Collector plate 3 is maintained in good mechanical contact with semiconductor wafer 2 by means of activator solder 4. Solder 4 may comprise indium or another acceptor activator element or alloy. When acceptor activator solder 4 is fused to the surface of germanium wafer 2, activator atoms are diffused into the germanium in such concentration as to exceed the donor impurity concentration originally giving the germanium wafer its N-type conduction characteristics. Thus a zone 9 of P-type germanium is created in the vicinity of the surface of the crystal wafer. The depth of penetration of this zone into the germanium body is governed by the fusion temperature and the duration of the heating process. Heating may be confined to the step of fusing the acceptor activator to the wafer in the soldering process, or heating of the entire assembly may be continued at an elevated temperature to enlarge the zone of P-type material. The temperature employed may range from 300° to 700° C. for germanium, and depends upon the particular activator element selected. The heating time may vary from slightly less than one second to several minutes, suitable impregnation of the activator material into the semiconductor body being accomplished when the activator solder wets the germanium wafer. Using an indium solder, temperatures in the vicinity of 400° C. for a few minutes have been found sufficient. As the result of the diffusion and impregnation, a rectifying barrier, or P-N junction, 10 is formed at the boundary between P-type zone 9 and the main body of semiconductor wafer 2. The fused impurity activator method of producing P-N junctions is described and claimed in my aforementioned copending patent application Serial No. 187,478.

Base contact 5 may conveniently comprise a perforated fernico plate of approximately 1/64 inch thickness having located therein a plurality of circular apertures 8 in closely spaced arrangement, the number of apertures depending only upon the number of emitter contacts desired. In general, the number of emitter contacts increases as the power level of the transistor is increased. Base plate 5 is maintained in good electrical conductive contact with N-type semiconductor body 2 by means of donor activator solder 6 between plate 5 and semiconductor wafer 2. Donor activator solder 6 may comprise an alloy of indium and approximately 1 to 30 percent, by weight, of a donor activator element such as arsenic, antimony or phosphorus, as disclosed and claimed in the copending application of John S. Saby, Serial No. 410,609, filed February 16, 1954, and assigned to the same assignee as the present invention. This donor activator solder may preferably be an alloy comprising approximately 95 percent indium and 5 percent, by weight, of arsenic. Solder 6 serves the dual purpose of maintaining base electrode 5 in good conductive contact with semiconductor wafer 2 and serving as a reservoir of negative conduction carriers for N-type semiconductor wafer 2.

The emitter of transistor 1 comprises a plurality of acceptor dots located within apertures 8 and fused to the surface of semiconductor wafer 2 which is left exposed when perforated base electrode 5 is attached to semiconductor wafer 2. These acceptor contacts may conveniently comprise indium or other suitable acceptor materials and are fused to and diffused within the surface of semiconductor wafer 2 in the same fashion as acceptor solder layer 4. In practice, acceptor contacts 7 may be easily located centrally within apertures 8 in base electrode 5 by drilling a small pilot recess 11 in the exposed surface of semiconductor wafer 2 subsequent to the attachment of base contact 5 to semiconductor wafer 2. This initial drilling locates the individual emitter contact 7 in the center of recess 8 in base electrode 5. After pilot recess 11 has been drilled in the exposed surface of semiconductor wafer 2 a small amount of indium or other acceptor material may be placed within this recess and the semiconductor wafer subjected to a temperature varying within the limits from 300° to 700° C., but preferably of the order of 400° C. for approximately one or two minutes. This heating causes the surface adjacent region 12 of semiconductor wafer 2 to be converted from N- to P-type germanium and causes the formation of a P-N junction 13 between surface adjacent P-type region 12 and the main body of N-type semiconductor wafer 2. During the heating operation, a nickel or fernico wire 14 may be placed within pilot recess 11 forming an emitter lead which may be connected to other emitter leads to form an emitter terminal 15 for transistor 1. The heating process should be controlled so that the P-type region 12 formed adjacent emitter contact 7 does not extend past the region not covered by base electrode 5. Thus, each emitter contact 7 is laterally surrounded by base electrode 5 and P-type region 12 is surrounded by the N-type main body of wafer 2. By so controlling the formation of P-type region 12, P-N junction 13 is not shorted out by base 5, and emitter, collector and base regions are closely disposed with respect to one another. In actual manufacturing processes, the fusion of collector plate 3, base plate 5 and emitter dots 7 to semiconductor wafer 2 may be conducted individually or all in the same heating process.

When transistor 1 is operated in an electrical circuit as an amplifier, oscillator or detector, potentials are supplied so that the emitter dots are operated in the forward direction and the collector plate is operated in the reverse or blocking direction. In operation, the passage of a forward current in the emitter circuit builds up a high concentration of holes and electrons in the germanium body 2 so that a fraction of the holes will diffuse to the collector contact 3. By providing a relatively close spacing between emitter contacts 7 and collector contact 3, it is possible for most of the emitter current to appear in the collector circuit. Additionally, by providing the base contact in close juxtaposition to the emitter contacts, the path of current flow through the semiconductor body from base to emitter is short and resistive heating due to this current is kept at a minimum. By locating the collector separately on one face of the semiconductor wafer 3 with no other electrodes upon that face, collector plate 3 may be easily conduction-cooled to keep its temperature within the proper rang of transistor operating temperatures, thus facilitating the attainment of high power level operation.

Devices constructed in accordance with this invention have been operated at power levels as high as 20 watts with no adverse effects. Additionally, devices made according to this invention are capable of current gains of approximately ⅓ to ½, with collector currents as high as one ampere.

Dimensions of a typical semiconductor body 2, which are here given by way of example only, since it is obvious that the size may be increased or decreased to accommodate operation at the desired power level, are approximately ¼ inch square and 0.15 inch thick. A semiconductor wafer having their dimensions may conveniently have seven emitter contacts contacting the wafer through a perforated base plate having seven apertures located therein, arranged in a hexagonal pattern, and spaced approximately 3/32 inch apart, as illustrated in Fig. 1.

It is to be understood, of course, that various equivalent elements or a combination of elements may be substituted for those specifically described in relation to the embodiment of Fig. 1. Thus, other acceptor activators, such as gallium or aluminum, may be substituted for indium. A semiconductor body having P-type conduction characteristics may also be employed, in which case the collector contact solder and the emitter contacts would comprise a donor activator material as for instance an alloy of indium and from 1 to 30 percent of a donor activator element, such as antimony, phosphorus or arsenic. The semiconductor body itself may be made of silicon instead of germanium. Likewise, of course, the number and configuration of the emitter contact dots may be increased depending upon the power level at which it is desired to operate the resultant transistor. In all cases, the emitter and collector activator elements are chosen to provide conduction carriers in the adjoining semiconductor material of an opposite sign to those of the zone associated with the base electrode.

Additionally, although the invention has been described with respect to a preferred embodiment in which a plurality of emitter contacts contact one surface portion of a semiconductor wafer and a single base contact surrounds the emitter and contacts the same surface, it will be appreciated that the improved characteristics of the invention may be obtained in a structure in which base and emitter contacts are reversed. Thus, the emitter may comprise an apertured plate contacting the major surface of the semiconductor wafer opposite the collector, and fused thereto with an acceptor solder, and the base may comprise a plurality of donor dots fused to the surface of the wafer within the emitter apertures.

It is obvious that although my invention has been described in connection with specific embodiments, many modifications may be made without departing from the spirit of the invention. It is to be understood, therefore, that I intend by the appended claims to cover all such modifications as fall within the true spirit and scope of my invention.

What I claim as new and desire to secure by Letters Patent of the United States is:

1. A junction transistor comprising a wafer of semiconductive material of one conductivity type having opposed major surfaces, a first opposite conductivity type inducing electrode contacting one major surface of said wafer and inducing therein a surface adjacent region of opposite conductivity type, a second electrode having therein a plurality of spaced apertures contacting the opposite major surface of said wafer, and a third electrode comprising a plurality of discrete junction type contacts centrally disposed within said second electrode apertures and contacting therein exposed surface portions of said wafer.

2. A junction transistor comprising a wafer of semiconductive material of one conductivity type having opposed major surfaces, a first opposite conductivity type inducing electrode contacting substantially all of one major surface of said wafer and inducing therein a surface adjacent region of opposite conductivity type, a base electrode in good conductive contact with a portion of the opposite major surface of said wafer, and a second opposite conductivity type inducing electrode laterally surrounding said base electrode contacting a second portion of said opposite major surface and inducing therein a region of opposite type conductivity.

3. A junction transistor comprising a wafer of semiconductive material of one conductivity type having opposed major surfaces, an opposite conductivity type inducing electrode contacting one major surface of said wafer and inducing therein a surface adjacent region of opposite conductivity type, a second opposite conductivity type inducing electrode having therein a plurality of spaced apertures contacting the opposite major surface of said wafer and inducing therein a region of opposite conductivity type, and a plurality of base contacts disposed within said second opposite conductivity type inducing electrode apertures and making good conductive contact therein with exposed surface portions of said wafer.

4. A junction transistor comprising a wafer of semiconductive material of one conductivity type having opposed major faces and having at one major face thereof a layer of opposite conductivity type, and at the other major face a plurality of discrete regions of opposite conductivity type, a collector contact to said layer, emitter contacts to said discrete regions, and a base contact to the one conductivity type portion of said opposite major face in close proximity to, and laterally surrounding, said emitter contacts.

5. A junction transistor comprising a wafer of semiconductive material of one conductivity type having opposed major surfaces, an opposite conductivity type inducing electrode contacting one major surface of said wafer, a base electrode having therein a plurality of spaced apertures in good conductive contact with the other major surface of said wafer, and a plurality of opposite conductivity type inducing contacts centrally disposed within said base electrode apertures and contacting therein exposed surface portions of said wafer.

6. A junction transistor comprising a wafer of semiconductive material of one conductivity type having opposed major surfaces, an opposite conductivity type inducing electrode contacting one major surface of said wafer and inducing therein a region of opposite conductivity type, a base electrode having therein a plurality of spaced apertures in good conductive contact with the other major surface of said wafer, and a plurality of opposite conductivity type inducing electrodes centrally disposed within said base electrode apertures and contacting therein exposed surface portions of said wafer and inducing therein discrete regions of opposite conductivity type.

7. A power transistor comprising a wafer of N-type germanium having opposed major surfaces, an acceptor contact to one major surface thereof, a base electrode having a plurality of spaced apertures therein in good conductive contact with the other major surface thereof, and a plurality of acceptor contacts centrally disposed within said base electrode apertures and contacting therein exposed surface portions of said wafer.

8. A power transistor comprising a wafer of N-type germanium having opposed major faces and having at one major face a P-type layer and at the opposite major face a plurality of discrete P-type regions, a collector contact to said layer, emitter contacts to said regions, and a base contact to the N-type portion of said opposite major face in close proximity to, and laterally surrounding, said emitter contacts.

9. A power transistor comprising a wafer of N-type germanium having opposed major surfaces, a first acceptor electrode contacting one major surface thereof, a second acceptor electrode having a plurality of spaced apertures therein contacting the opposite major surface thereof, and a plurality of base contacts centrally disposed within said second acceptor electrode apertures and making therein good conductive contact with the exposed surface portions of said wafer.

References Cited in the file of this patent

UNITED STATES PATENTS

| | | |
|---|---|---|
| 2,524,033 | Bardeen | Oct. 3, 1950 |
| 2,595,052 | Casellini | Apr. 29, 1952 |
| 2,672,528 | Shockley | Mar. 16, 1954 |
| 2,673,948 | Matare et al. | Mar. 30, 1954 |
| 2,680,220 | Starr et al. | June 1, 1954 |

FOREIGN PATENTS

| | | |
|---|---|---|
| 1,080,034 | France | May 26, 1954 |